(12) United States Patent
Petersen

(10) Patent No.: US 7,088,745 B2
(45) Date of Patent: Aug. 8, 2006

(54) LASER SYSTEM WITH EXTERNAL OPTICAL FEEDBACK AND USE OF SUCH SYSTEM IN THE GRAPHICAL INDUSTRY

(75) Inventor: Paul Michael Petersen, Hillerod (DK)

(73) Assignee: Esko-Graphics A/S, Ballerup (DK)

( * ) Notice: Subject to any disclaimer, the term of this patent is extended or adjusted under 35 U.S.C. 154(b) by 318 days.

(21) Appl. No.: 10/363,765

(22) PCT Filed: Sep. 5, 2001

(86) PCT No.: PCT/DK01/00576

§ 371 (c)(1),
(2), (4) Date: Apr. 18, 2003

(87) PCT Pub. No.: WO02/21651

PCT Pub. Date: Mar. 14, 2002

(65) Prior Publication Data

US 2003/0165165 A1    Sep. 4, 2003

(30) Foreign Application Priority Data

Sep. 5, 2000    (DK)    ............................... 2000 01321

(51) Int. Cl.
*H01S 3/098*   (2006.01)
*H01S 3/08*    (2006.01)
(52) U.S. Cl. ............................ 372/19; 372/98; 372/108
(58) Field of Classification Search .................. 372/19, 372/98, 92, 108
See application file for complete search history.

(56) References Cited

U.S. PATENT DOCUMENTS 4,995,050 A * 2/1991 Waarts et al. .................. 372/95

(Continued)

FOREIGN PATENT DOCUMENTS

JP          3-142988          6/1991

(Continued)

OTHER PUBLICATIONS

C.J. Chang-Hasnain et al., "High Power With High Efficiency in a Narrow Single-Lobed Beam form a Diode Laser Array in an External Cavity," Applied Physics Letters, vol. 50, No. 21, pp. 1465-1467 (May 25, 1987).*

(Continued)

*Primary Examiner*—James Menefee
(74) *Attorney, Agent, or Firm*—Darby & Darby

(57) ABSTRACT

A diode laser system providing a high-power laser beam with good spatial coherence, which can be focused to a small spot size over long distances and which has a good pointing stability. The laser system comprises a laser diode (301) adapted to emit a first light beam, where the first light beam comprises a plurality of spatial modes, selection means (304) adapted to select a predetermined part of the first light beam, and a reflector (306), where the laser diode and the reflector define a cavity and where the reflector is adapted to reflect the selected part of the first light beam back into the laser diode as a second light beam. The laser system is characterised in that the selection means is adapted to select a part of the first light beam corresponding to a spatial mode with a higher mode number than a spatial mode with maximum gain.

33 Claims, 8 Drawing Sheets

U.S. PATENT DOCUMENTS 5,027,359 A * 6/1991 Leger et al. ............... 372/18
5,555,253 A    9/1996 Dixon ....................... 372/29
5,594,744 A    1/1997 Lefevre et al. ........... 372/20

FOREIGN PATENT DOCUMENTS

| JP | 5-206579 | 8/1993 |
| JP | 5-206580 | 8/1993 |
| WO | 98/15994 | 4/1998 |
| WO | 98/56087 | 12/1998 |

OTHER PUBLICATIONS

Martin B.H. Lobel, Ph.D., "Improvement of the Coherence Characteristics of Laser Diode Arrays Using Photorefractive Phase Conjugation", Thesis at the Riso National Laboratory, Aug. 1998, Riso Denmark ISBN 87-550-2373-8).

* cited by examiner

LASER SYSTEM WITH EXTERNAL OPTICAL FEEDBACK AND USE OF SUCH SYSTEM IN THE GRAPHICAL INDUSTRY

This invention relates to an improvement of the spatial coherence properties of laser diode systems.

For many applications it is desirable to use lasers with high output power and good spatial coherence properties.

Laser diodes are well known as reasonably priced, small and robust sources of laser beams. Conventional laser diodes with small output power and good coherence properties have been available, and they are used in many applications such as CD players, bar-code readers etc.

More recently laser diodes with several Watts of output power have become available. These high-power laser diodes are potentially applicable in other areas such as the exposure of print plates in the graphical industry. However, these laser diodes have a large light-emitting area of typically 1–2 μm×100–500 μm and, consequently, they have poor spatial coherence properties in the lateral direction of the light-emitting aperture, the so-called low-coherency axis. Due to this disadvantage, the resulting light beam cannot be focused to a small spot size over long distances. A measure of quality used in connection with light sources is the so-called $M^2$ value. The $M^2$ value is related to the ability of a light source to be focused.

The international patent application WO98/15994 discloses an external cavity micro laser system comprising a multimode microlaser and an external cavity including the micro laser, a return section and an output section. The output section comprises a spatial filter for selecting a portion of the transverse distribution of the laser beam and an output coupler which includes feedback means for causing a fraction of the energy of the selected portion to be fed back into the laser for amplification in the return section of the cavity.

However the above prior art system involves the disadvantage that it does not emit sufficient power with a sufficiently low value of $M^2$, preferably smaller than 2, to make it applicable in areas that require a high-power beam which can be focused well even over long distances. An example for such an application is the exposure of material, for example print plates, in internal drum image setting machines, external drum image setting machines, flatbed image setting machines or the like.

These applications require high-power laser beams, which can be focused to a small spot over long distances, which have a good pointing stability, and whose wavelength match the sensitivity of the material to be exposed.

A simple replacement of the laser diode with one that has a higher output power, for example 4W, would not solve the disadvantage of the prior art systems, because high-power laser diodes have a broader emission angle and a considerably broader frequency spectrum, and thus poor temporal coherence properties, and a high $M^2$ value of for example between 30–500. Furthermore, they have a poor pointing stability.

It is a further disadvantage of the above prior art system that it is difficult to align.

From WO 9856087 it is known to replace a conventional reflector, such as a mirror or grating, by an adaptive light feedback, such as a phase-conjugate mirror, which may adapt to counteract various types of changes imposed on the system and thus may stabilize the system.

However, it is a disadvantage of the above prior art system that adaptive light feedback systems are expensive.

Therefore, it is an object of the present invention to provide a low-cost laser system for emitting high-power light that can be focused to a small spot size over long distances.

It is another object of the present invention to provide a laser system with good spatial coherence.

It is yet a further object of the present invention to provide a laser system for emitting a laser beam with a small value of $M^2$.

It is another object of the present invention to provide a laser system that is easy to align and a method of aligning.

It is a further object of the present invention to provide a laser system with a high pointing stability of the emitted beam, and a method of adjusting.

It is a further object of the present invention to provide a laser system with a good long-term power stability of the emitted beam, and a method of adjusting.

The spatial characteristics of the light emitted from broad area lasers, laser diode arrays or the like are known to comprise a superposition of a plurality of spatial modes.

Due to a strong overlap of different modes it is difficult to align the laser system such that only a substantial portion of a single mode is reflected back into the laser cavity without also reflecting substantial portions of other modes. However, a selective reflection of a single mode is desirable in order to provide a constructive feedback to a single mode only and to suppress all other modes. This would result in the output of a substantial portion of the light intensity within one mode and, therefore, good spatial coherence properties.

In the present invention it is realized that the above problems can be overcome when a laser system, preferably for use in an image setter, the laser system comprising a laser diode adapted to emit a first light beam, the first light beam comprising a plurality of spatial modes where each spatial mode has a mode number assigned to it, selection means adapted to select a predetermined part of the first light beam, and a reflector where the laser diode and the reflector define a cavity and where the reflector is adapted to reflect the selected part of the first light beam back into the laser diode as a second light beam, is characterised in that the selection means is adapted to select a part of the first light beam corresponding to a spatial mode with a higher mode number than a spatial mode with maximum gain.

Hence, the invention is based on the result that a selection of a spatial mode with a high mode number yields an output beam which comprises a high percentage of the output power of the laser diode in a narrow lobe and which may be focused to a small spot size even over large distances. This is because the modes with high mode numbers and low gain are very sensitive to the feedback provided and, therefore, a single mode is easier to separate from its adjacent modes by providing a selective feedback, thereby yielding a coherent output beam.

According to a preferred embodiment of the invention, the selection means is adapted to substantially select a single spatial mode. When the laser system emits a high percentage of the output power of the laser diode in a single spatial mode, the coherence properties of the output beam of the laser system are further improved.

In an advantageous and preferred embodiment the mode which is fed back into the laser is one which normally is not lasing in the free-running laser, i.e. which is substantially not present in the first light beam when the laser diode is operated without the reflector. Experiments performed by the inventor have surprisingly shown that the output beam generated by a laser system according to this embodiment of the invention may be particularly well focused and at the same time comprises a high optical power.

In a preferred embodiment of the invention the selection means comprises a first spatial filter placed within the cavity defined by the laser diode and the reflector. The position and aperture of first spatial filter may be adapted to only allow the transmission of substantially one spatial mode. The first spatial filter may be a slit comprising two sharp edges.

The position and the aperture of the first spatial filter may be adjusted, e.g. by a piezo element.

It is understood that different selection means may be provided. For example, the reflector may be a narrow stripe mirror the edges of which define a spatial filter, since only the part of the first light beam propagating in the direction of the mirror is reflected back into the laser diode.

According to a preferred embodiment of the invention the system further comprises a system of optical lenses which creates a pseudo far-field as an image of the Fourier plane of a collimating lens.

In a preferred embodiment the selection means may be positioned substantially in said Fourier plane. It is an advantage of this embodiment that the spatial modes are well-separated in the Fourier plane, and may, therefore, easily be separated by the selection means.

When the system further comprises a second spatial filter adapted to only allow the transmission of a part of the first light beam which is not selected by the selection means, the output beam of the laser system is filtered. Thereby, a considerable noise reduction is achieved and undesired spatial modes are further suppressed, thereby further improving the $M_2$ value of the output beam. Preferably, the second spatial filter is placed substantially in the Fourier plane.

When the reflectivity of the output facet of the laser diode is between 0.01% and 4%, for example 0.2%, a further increase of the output power of the laser system may be achieved.

In a preferred embodiment the reflectivity of the output facet is adjusted to correspond to the mode which is fed back into the laser diode.

The laser diode may be a laser diode array, a broad area laser, a laser diode bar, a stacked laser array or the like.

When the system further comprises an optical element in the external cavity, the optical element having a transmittance which is smaller than 100%, the amount of feedback provided to the laser cavity may be adjusted and optimised corresponding to the mode which is fed back into the laser diode.

When the transmittance of the optical element is adjustable, the amount of feedback may continuously be adjusted in order to optimise the quality and power of the output beam.

The reflector may be a mirror, a grating, or the like. The reflector may also be the output facet of the laser diode, where the output facet is not completely parallel to the rear facet of the laser diode. The position and orientation of the reflector may be adjusted by a piezo element.

It is an advantage of the invention that it comprises low-cost components which can be arranged in a compact design.

It is an advantage of the invention that it provides a laser system with a high pointing stability, as it eliminates variations in the direction of the output beam caused by a phenomenon called spatial mode competition. This phenomenon occurs, when the laser operates in a plurality of competing modes with different output angles. If the dominant mode of the laser changes over time, the output angle changes and, thus, the pointing stability decreases. However, when the laser is forced to operate in a single mode, this problem is overcome resulting in a high pointing stability.

According to a second aspect of the invention the mentioned objects are achieved by a method of aligning a laser system for emitting an output beam where the laser system comprises a laser diode adapted to emit a first light beam along an axis, the first light beam comprising a plurality of spatial modes where each spatial mode has a mode number assigned to it, selection means adapted to select a predetermined part of the first light beam, and a reflector, where the laser diode and the reflector define a cavity and where the reflector is adapted is to reflect the selected part of the first light beam back into the laser diode as a second light beam;

the method comprising the step of aligning the selection means such that it selects a part of the first light beam corresponding to a spatial mode with a higher mode number than a spatial mode with maximum gain.

According to a preferred embodiment of the invention the selection means comprises a first spatial filter placed within the cavity and comprising an inner edge with adjustable position proximal to the axis and an outer edge with adjustable position distal to the axis; the method further comprising the steps of measuring a predetermined property of the first light beam;

adjusting the position of the inner edge of the first spatial filter until the predetermined property has a predetermined value;

adjusting the position of the outer edge of the first spatial filter until the predetermined property is substantially optimised.

It is an advantage of this method of aligning that substantially a single spatial mode of the laser diode may be selected. This method is particularly suitable when the single mode is a mode with a high mode number which is not present in the emission of the free running laser. When the position of the inner edge of the first spatial filter is adjusted, the lower order spatial modes which correspond to a small angle from the centre axis are suppressed and the lasing of a spatial mode with a high mode number which is not present in the free-running laser may effectively be induced.

In a preferred embodiment the predetermined property is the shape of the intensity distribution of the first light beam. In a further preferred embodiment the predetermined shape is characterised by a narrow far-field angle of the output beam.

According to another preferred embodiment of the invention, the predetermined property is a measure of the ability of the output beam to be focused, preferably the $M^2$ value of the output beam.

According to another preferred embodiment of the invention the laser system comprises an adjustable optical element adapted to control the energy of the second light beam; and the method comprises the steps of measuring a characteristics of the output beam;

adjusting the adjustable optical element until the characteristics has a predetermined value.

It is an advantage of the invention that the output laser beam of the laser system has good spatial coherence.

It is a further advantage of the invention that the laser system may easily be aligned and that the system may be kept aligned.

In a preferred embodiment the adjustable optical element is an optical element with adjustable transmittance or a spatial filter with adjustable aperture.

In another preferred embodiment the characteristics is the power of the laser beam, the angular power density of the laser beam, or the spatial coherence of the laser beam.

The invention will be explained more fully below in connection with preferred embodiments and with reference to the drawings, in which.

Figure 1:
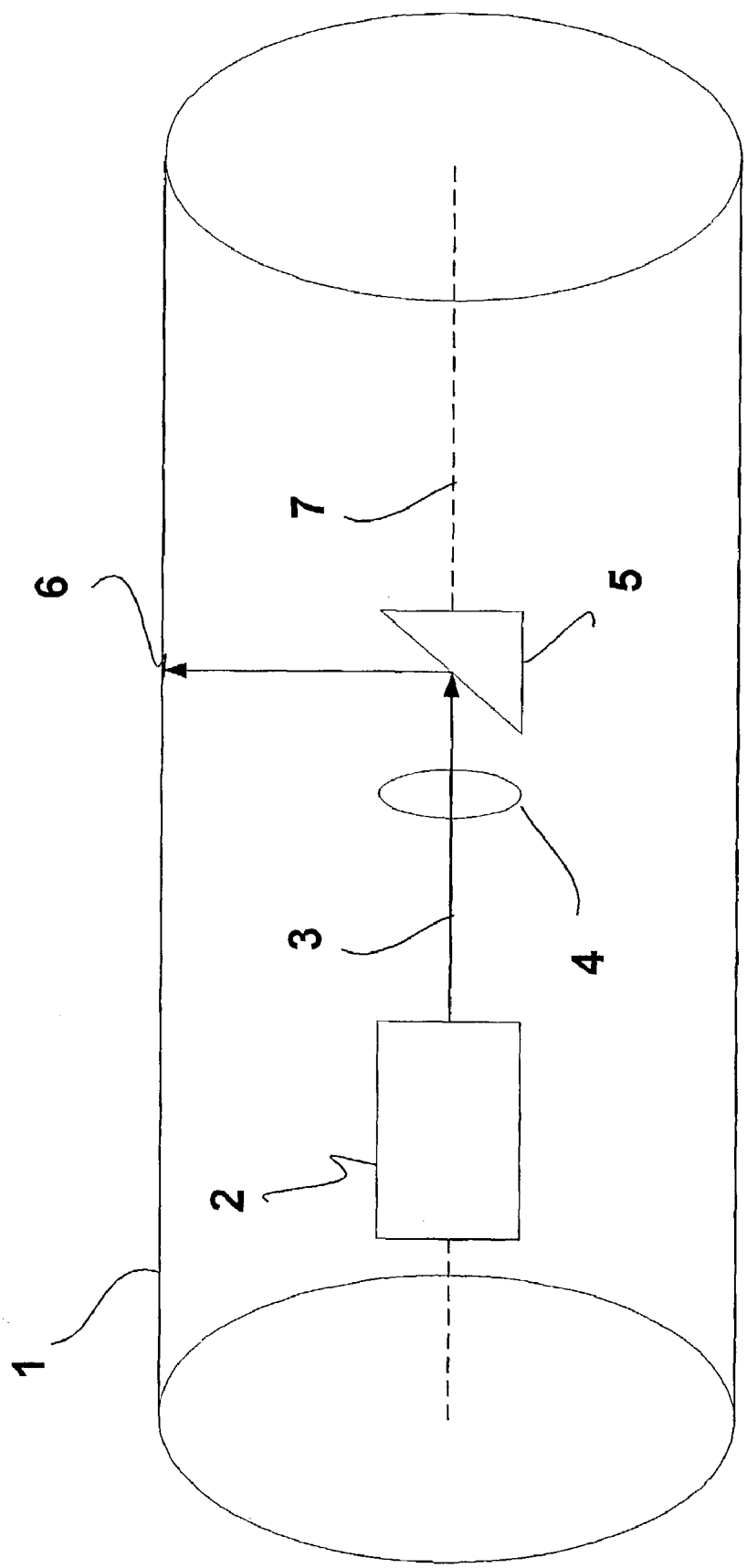
FIG. 1 shows an application of the invention in the graphical industry.

FIG. 1 schematically shows an application of a laser system according to the present invention in an internal drum image setting machine. The material to be exposed, for example a print plate is mounted on the inner surface of a cylinder 1. A laser beam 3 is emitted by a laser diode system 2 according to the present invention along the axis 7 of the cylinder 1. The beam 3 is focused by a lens 4 and reflected by a rotating mirror 5 such that the beam 3 is focused as a small spot 6 on the inner surface of the cylinder 1. The mirror 5 may rotate at a high speed, for example 30,000 rotations per minute, around the cylinder axis 7. At the same time the mirror is moved along the axis 7. In order to achieve a fast exposure of the entire film, a strong laser beam 3 is required that can be focused over a distance that at least corresponds to the radius of the cylinder 1. The radius of the cylinder 1 may be 200 mm and is determined by the size of the material to be exposed. In order to achieve high quality printing, the size of the spot 6 should be small. If the laser system 2 was a known laser diode with an $M^2$ value of for example 50, the lens 4 would have to be substantially larger that the diameter of the cylinder 1 in order to be able to focus the laser beam as a small spot 6 on the inner surface of the cylinder 1.

Figure 2:
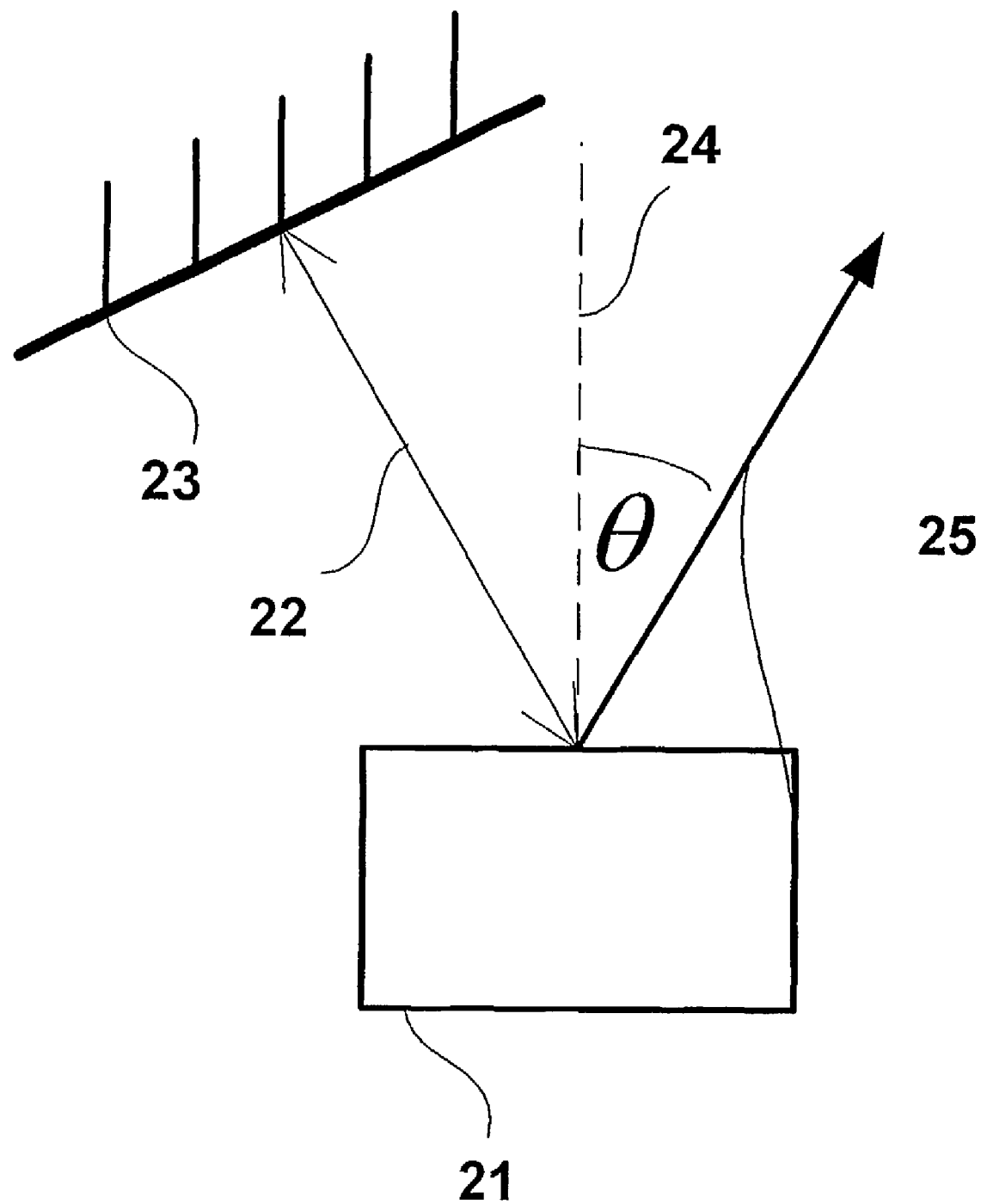
FIG. 2 shows a schematic view of a first embodiment of the present invention.
Figure 3:
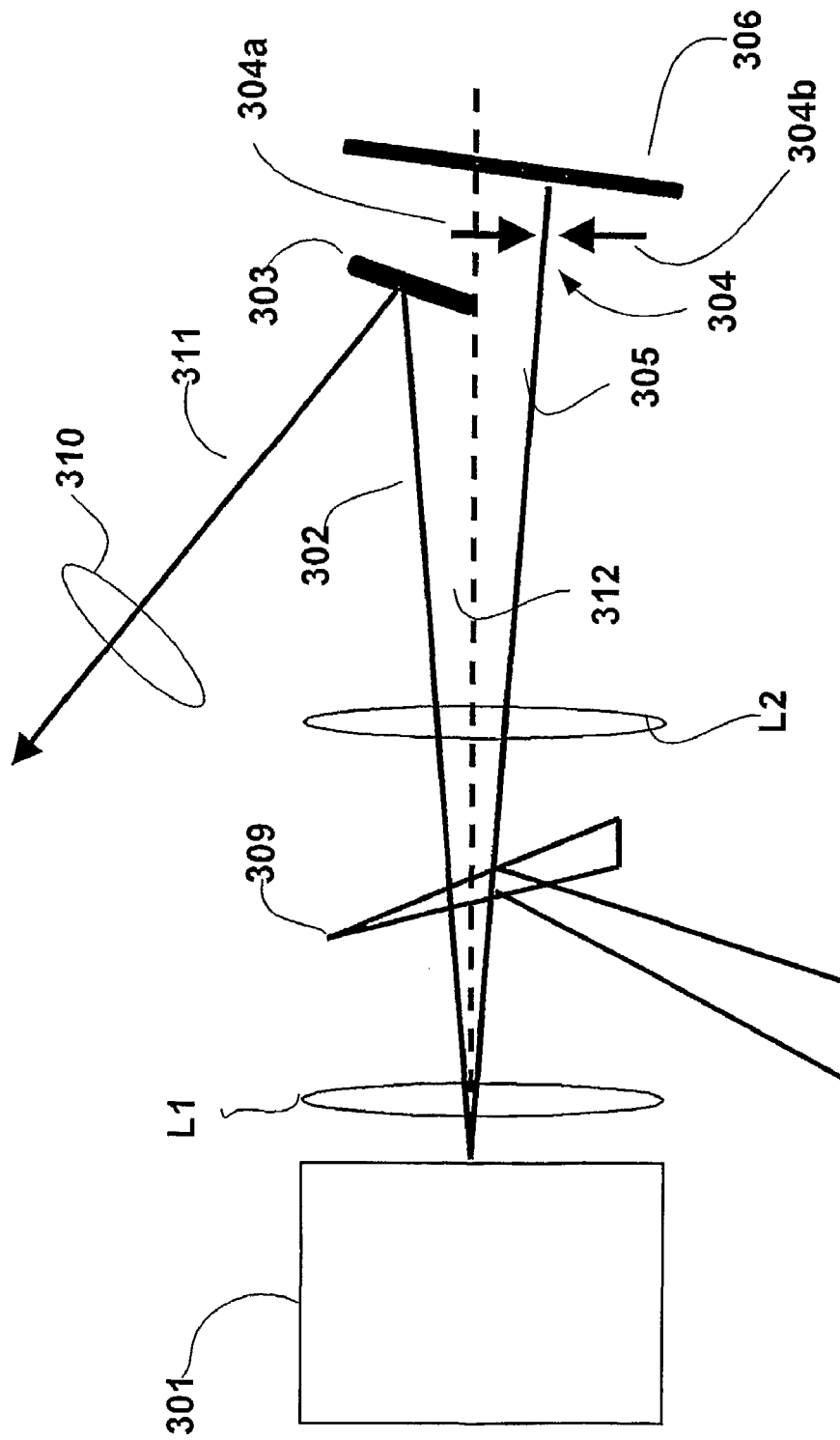
FIG. 3 shows a schematic view of a second embodiment of the present invention.

FIG. 2 schematically shows a first embodiment of the present invention. An external feedback configuration comprises a laser diode 21 and a planar or spherical mirror 23. The optical power emitted by the free-running laser diode has a far-field angular intensity distribution in the plane of the drawing similar to the one shown as curve 42 in FIG. 4. The distribution is a superposition of a plurality of twin-lobed spatial modes. In FIG. 2, the mirror 23 reflects a part of one far-field lobe of a spatial mode, which corresponds to an angle θ, back into the laser diode. Preferably, the spatial mode may be selected by a spatial filter, such as an adjustable slit, placed between the laser diode 21 and the mirror 23. The laser diode 21 and the mirror 23 define an external cavity. The feedback from this cavity results in a bi-directional beam propagation 22 between the laser diode 21 and the mirror 23. Consequently, light of the spatial mode corresponding to the angle θ is fed back into the lasing cavity of the laser diode 21. As a result of this feedback, the laser diode 21 is seeded to predominantly oscillate in the spatial mode corresponding to θ, and the second lobe 25 of the corresponding twin-lobe structure is emitted at an angle θ opposite to a centre plane 24 perpendicular to the low-coherency axis of the laser diode 21. If the cavity is adapted to provide feedback for a high-order mode which is not present in the free-running laser, the output beam has an intensity distribution with a sharp peak corresponding to a single spatial mode with a small value of M FIG. 3 schematically shows a second embodiment of the invention. It shows a laser system with external optical feedback. The system comprises a 4 W laser diode 301 with a light emitting aperture of 2×200 µm. The output facet of the laser diode is coated with an antireflection coating providing a reflectivity of 0.2%. The laser emits a light beam along an axis 312 comprising a plurality of spatial modes, where each mode has a far-field twin-lobe intensity distribution. One of the far-field lobes 305 is reflected back into the laser diode 301 by a first mirror 306 and the other far-field lobe 302 is extracted from the external cavity by a second mirror 303. The output beam 311 is focused by a lens 310 and may be analysed by a beam analyser (not shown) in different distances from the focal plane of the lens 310. A slit 304 formed by two razor blades is placed within the cavity defined by the laser diode 301 and the mirror 306. The position and the aperture of the slit may be adjusted so as to select a far-field lobe corresponding to a spatial mode with a high mode number. For example, the razor blades forming the slit may be moved relative to each other in order to adjust both the position and the opening of the slit. Hence, the spatial mode selected by the slit 304 is reflected back by the mirror 306 into the laser diode 301 where it is amplified by the active medium of the laser diode 301. Consequently, the selected mode experiences a high gain, and the other modes are effectively suppressed. The other lobe 302 of the twin-lobe distribution of the selected mode may thus be extracted from the cavity by the mirror 303. The system further comprises two lenses L1 and L2, which generate a pseudo far-field in the plane of the slit 304. Between the lenses L1 and L2, a wedge 309 is inserted which extracts a part of the laser beam for diagnostic purposes. A part of the laser beam 302, for example 10%, may be used to measure the beam properties in different distances from the far field.

Figure 4:
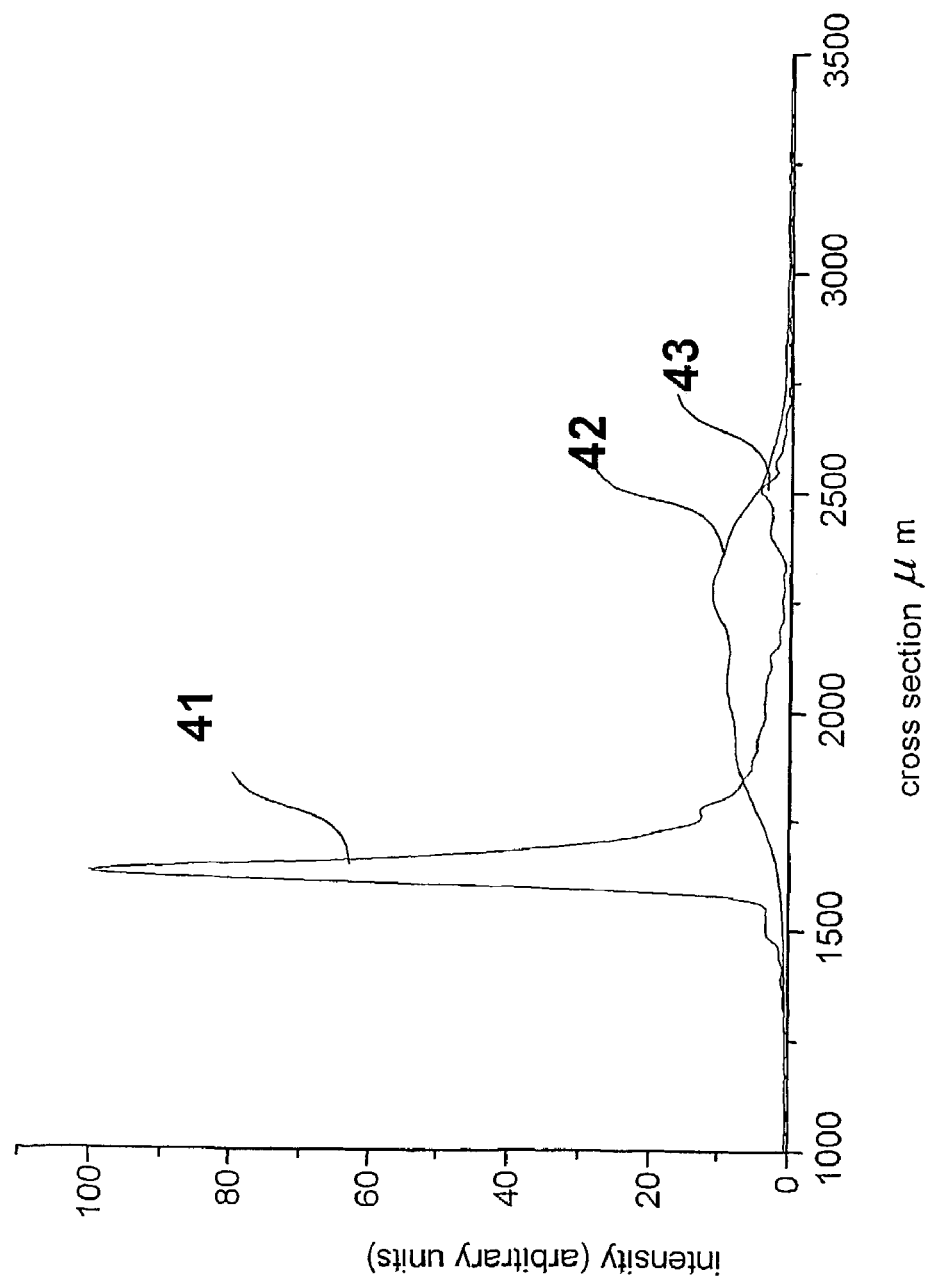
FIG. 4 shows the far-field power distribution of the embodiment of FIG. 3.

FIG. 4 shows the far-field power distribution of the output beam 311 of the embodiment of FIG. 3. The spatial characteristics of the light emitted from broad area lasers or laser diode arrays are known to comprise a superposition of a plurality of spatial modes. Each of these modes has a tendency to emit the optical power in a twin-lobed far-field, where the two lobes each are centred around an angle +/−θ, respectively, relative to a centre plane perpendicular to the low-coherency axis of the laser, corresponding to θ=0°. The value of θ depends upon the mode number, and larger mode numbers correspond to larger values of θ. However, the angular distribution of adjacent modes is strongly overlapping and, consequently, the typical total far-field distribution of a high-power laser diode may approximately resemble a uniform energy distribution within a range of angles.

Furthermore, it is well-known that there is a spatial mode corresponding to a mode number $N_{max}$, where $N_{max}$ may for example be equal to 10, which experiences a maximum gain in the internal cavity of the laser diode. Modes with mode numbers smaller and larger than $N_{max}$ experience increasingly weaker gain compared to the mode $N_{max}$. Especially higher modes are strongly suppressed and consequently the typical total far field distribution of a laser array operated far above threshold may resemble a uniform energy distribution in a range $\theta \cong \theta_{max}$ to $+\theta_{max}$, where $\theta_{max}$ may for example be 3°. FIG. 4 shows measured far-fields from the laser diode with (curve 41) and without (curve 42) optical feedback, respectively. The wavelength of the output beam is 804 nm, and the laser diode is operated at 1.7 A. With feedback the radiation angle in the far-field is decreased by approximately a factor of 10 with almost all the optical power, up to 90%, contained in this state with high spatial coherence. The optimal peak of the power distribution with feedback 41 is situated at a large distance from the centre of the distribution 42 of the free-running laser. This corresponds to a spatial mode with high mode number and large angle θ. It is noted that the distribution further comprises a small peak 43 around an angle −θ corresponding to the lobe of the selected spatial mode in the direction of the feedback cavity.

Figure 5:
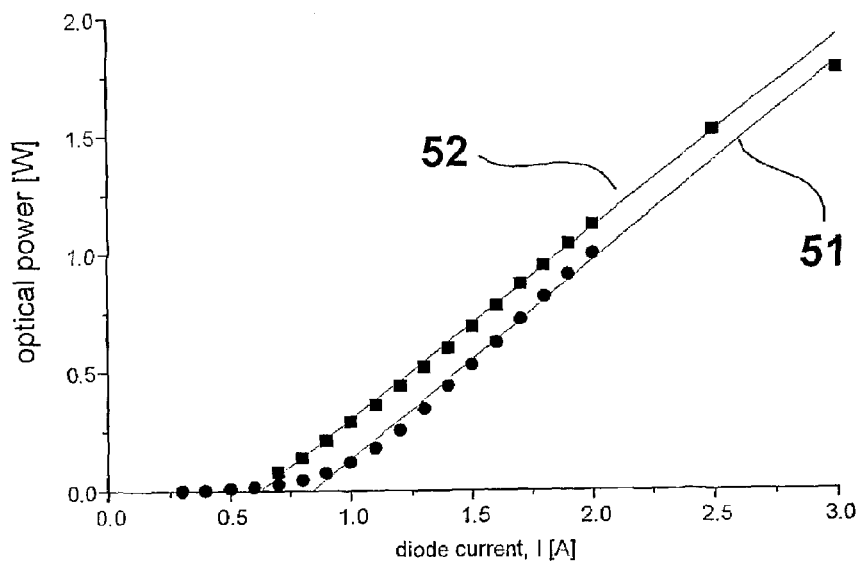
FIG. 5 shows the light/current characteristic of the embodiment of FIG. 3.

FIG. 5 shows the light-current characteristics of the embodiment of FIG. 3. The optical power versus diode current is shown in the figure with (curve 52) and without (curve 51) feedback, respectively. One important effect, caused by the antireflection coating of the output facet, is that the threshold of the laser is reduced by 0.3 A when the feedback is on. Furthermore it is experimentally observed that the slope efficiency is 0.81 with external feedback. This means that an increase of the diode current by 1 A results in an increase of the optical power by 0.81 W. The slope efficiency without feedback is 0.84. This shows that the diode with external feedback is operated with a very high efficiency in a mode with high spatial coherence.

Figure 6:
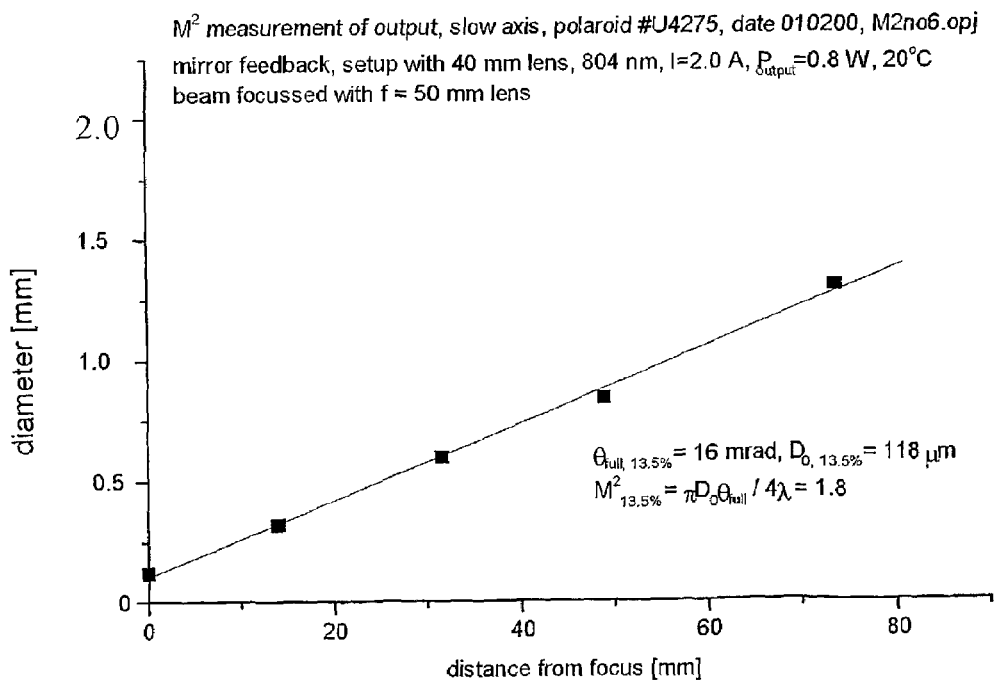
FIG. 6 shows the $M^2$ measurement of the output of the embodiment of FIG. 3.

FIG. 6 shows the $M^2$ measurement of the output of the embodiment of FIG. 3 along the low-coherency axis. The $M^2$ value is related to the ability of a light source to be focused compared to a theoretical optimum, i.e. a light source with a Gaussian intensity distribution. The measurement of $M^2$ does not only take the beam properties in the far field into account but rather at different distances from the focal plane. If, for example, a light source has an $M^2$ value of 3, the light beam of this source is referred to as being 3 times diffraction limited. The quality parameter $M^2$ has been measured along the low-coherency axis as shown in FIG. 6 and along the high-coherency axis (not shown). When the feedback is on, the $M^2$ of the low-coherency axis of the diode is decreased to a value of 1.8. The $M_2$ value of the high-coherency axis of the laser diode is measured to 1.9. Since the high-coherency axis of the diode corresponds to an almost diffraction limited spatial mode these results show that the low-coherency axis is improved to almost the fundamental limit by the optical feedback.

Figure 7:
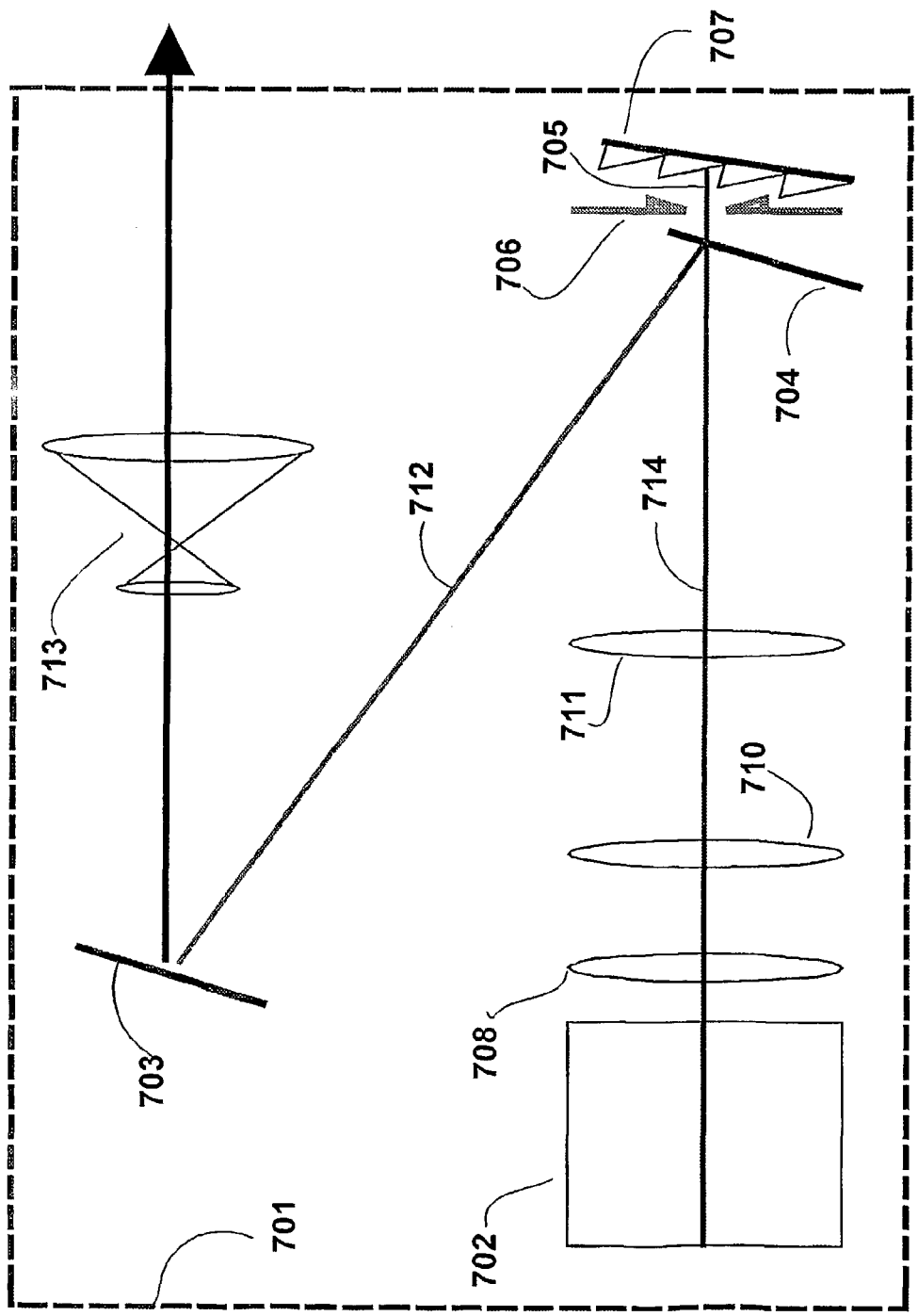
FIG. 7 shows a schematic view of a third embodiment of the present invention.

FIG. 7 schematically shows a third embodiment of the present invention. It shows a laser system 701 with external feedback comprising a broad area 4 W GaAlAs gain-guided laser 702. The laser emits a light beam 714 comprising a plurality of spatial modes, where each mode has a far-field twin-lobe intensity distribution perpendicular to the plane of the drawing. One of the far-field lobes 705 is reflected back into the laser diode 702 by a grating 707 and the other far-field lobe is extracted from the external cavity by a mirror 704. The mirror 704 is adapted to only reflect a part of the light beam 714 which is not transmitted through the spatial filter 706. This filtering of the output beam 712 improves the spatial coherence of the output beam by reducing the effect of background noise. The output beam 712 is transmitted via a second mirror 703 through a beam expander 713 consisting of two cylindrical lenses. The purpose of this beam expander is to transform the output beam 712 into a circular beam. According to the invention, a spatial mode with high mode number is selected by a slit 706 formed by two razor blades. The system further comprises a spherical lens 708 and two cylindrical lenses 710 and 711, which generate a pseudo far-field in the plane of the slit 706.

Figure 8:
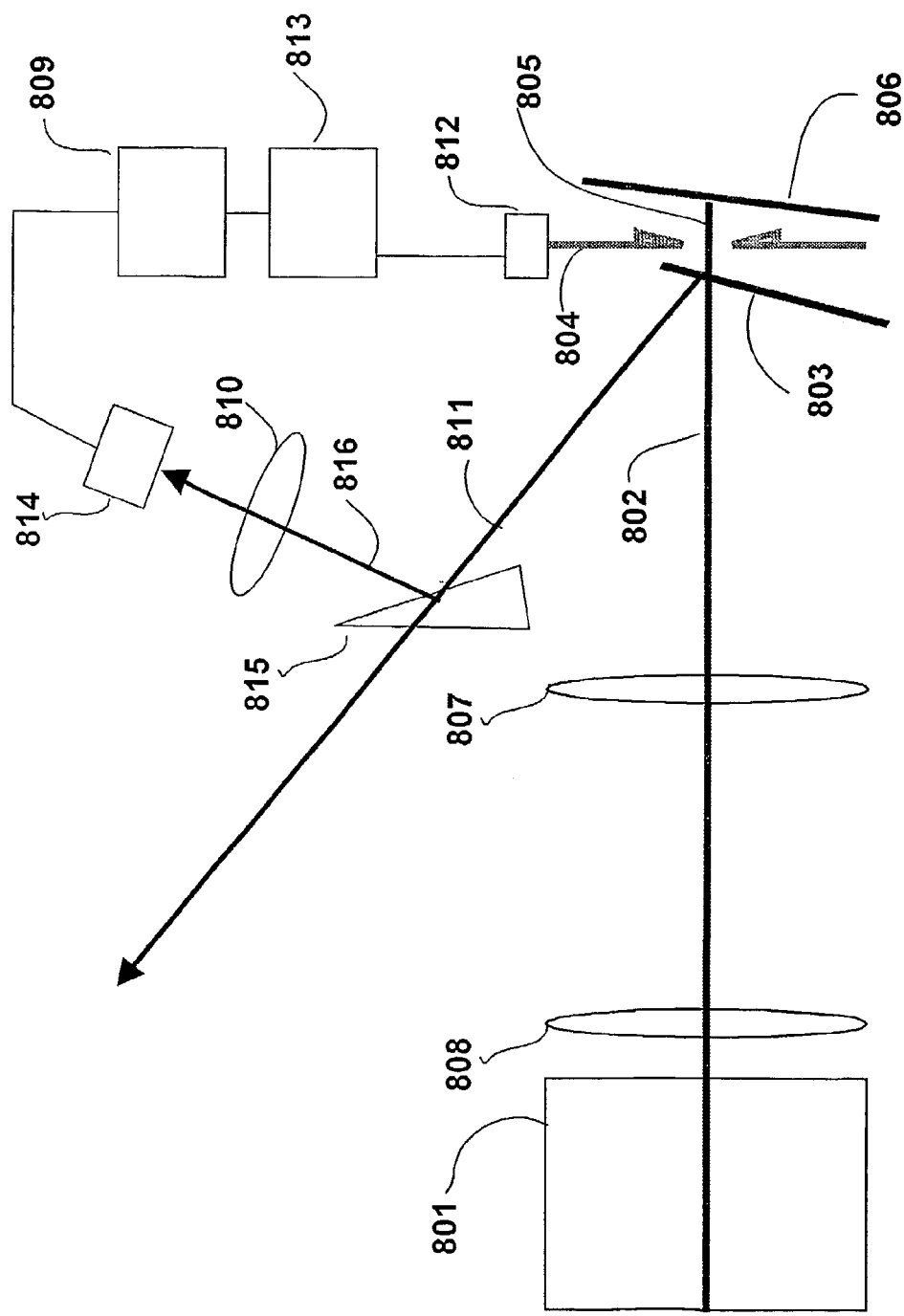
FIG. 8 shows a schematic view of a fourth embodiment of the present invention.

FIG. 8 schematically shows a forth embodiment of the present invention. It shows a laser system with external optical feedback. The system comprises a 4 W laser diode 801 with a light emitting aperture of 2×200 µm. The laser emits a light beam 802 comprising a plurality of spatial modes, where each mode has a far-field twin-lobe intensity distribution perpendicular to the plane of the drawing. One of the far-field lobes 805 is reflected back into the laser diode 801 by a mirror 806 and the other far-field lobe is extracted from the external cavity by a mirror 803. According to the invention, a spatial mode with high mode number is selected by a slit 804 formed by two razor blades, which may be moved relative to each other. The system further comprises two lenses 807 and 808, which generate a pseudo far-field in the plane of the slit 804. The system further comprises a wedge 8.15 which extracts a small portion, for example 5%, of the output beam 811. A collimating lens 810 focuses the extracted light beam 816. A beam analyser 814 is placed in the focal plane of the lens 810. The beam analyser measures the intensity profile of the extracted beam 816. The measured signal is digitally analysed in an analysis unit 809, where the width of the dominant peak of the measured intensity profile is calculated. Based on the calculated width, a control unit 813 controls a piezo element 812 to adjust the size of the aperture of the slit 804 until the width of the dominant peak is minimized.

Figure 9:
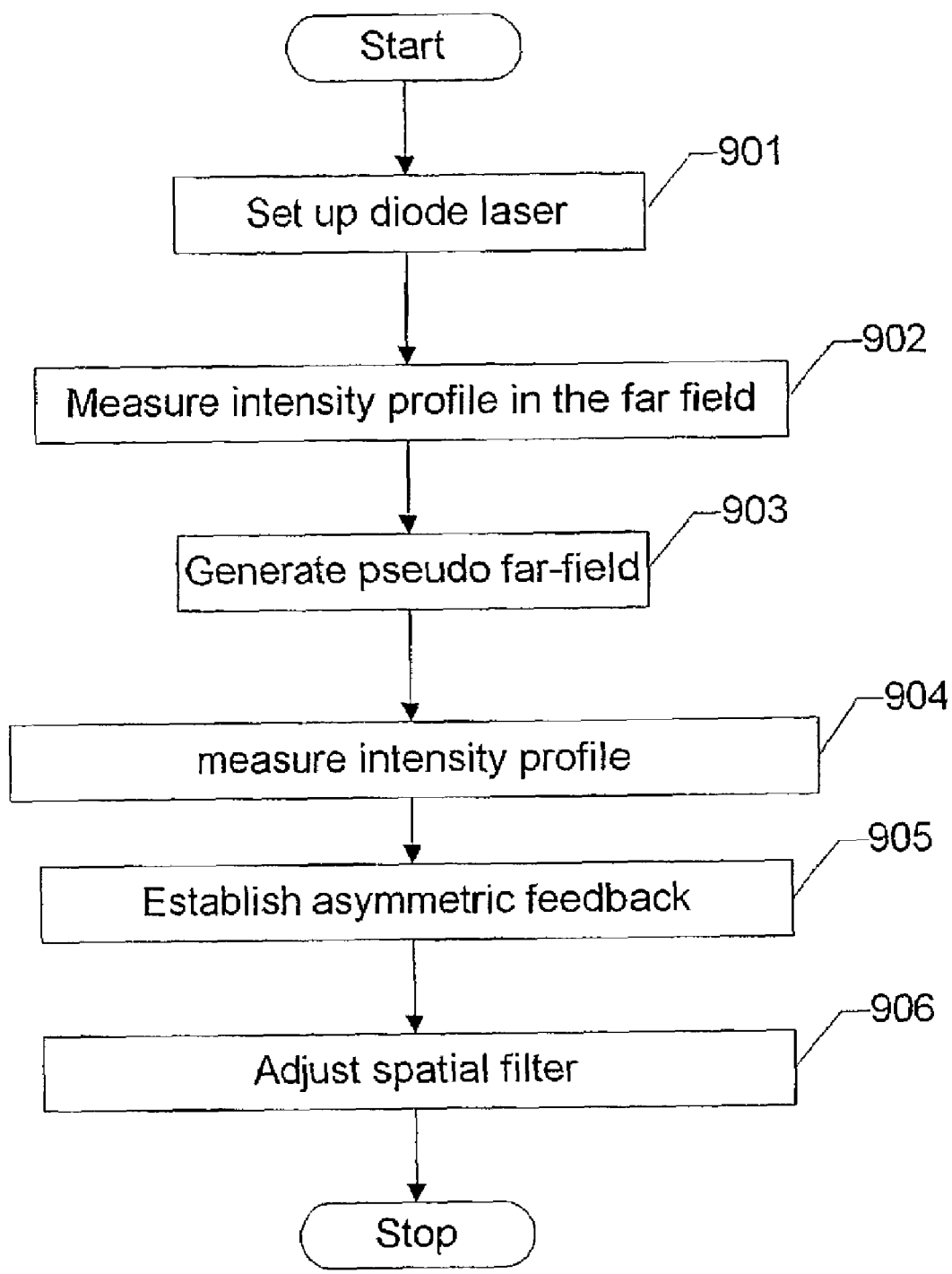
FIG. 9 shows a flow diagram of a method of aligning a laser system according to an embodiment of the invention.

FIG. 9 shows a flow diagram of a method of aligning a laser system on an optical table according to an embodiment of the invention. In the following reference is also made to the system illustrated in FIG. 3.

Setting up the high power laser diode (Step 901): A single broad stripe laser diode 301 with stripe width 25–700 µm is placed on an optical table with its junction perpendicular to the table plane. In FIG. 3, the table plane is orthogonal to the plane of the drawing. The high-coherence axis of the laser diode is in the horizontal direction and the low-coherence axis is in the vertical direction.

Measuring the intensity profile in the far field (step 902): The far-field intensity profile of the laser diode 1–2 m after the laser diode is measured in the vertical direction. The current to the laser is varied to I=1.1 $I_{th}$; I=2 $I_{th}$; I=3 $I_{th}$ ($I_{th}$ being the threshold current of the laser diode) until the maximum current is obtained, and for each current setting the far field intensity distribution is measured.

Generation of a pseudo far-field at the position of the spatial filter (step 903): The far-field intensity profile is now reconstructed at the position of the spatial filter using two lenses L1 and L2. The laser may be operated at I=1.5 $I_{th}$ during this procedure. A lens L1 with a small focal length $f_{L1}$, e.g. $f_{L1} \approx 3-5$ mm, is placed right in front of the laser. This short focal length lens collimates the beam in the horizontal plane. A cylindrical lens L2 is used to collimate the beam in the vertical direction. A low reflection beam splitter wedge 309 is placed after L2. Alternatively, the wedge 309 may be placed between L1 and L2 as illustrated in FIG. 3. The wedge provides two reflections which can be used to measure the intensity profile and the frequency spectrum of the laser diode, respectively.

The spatial filter is now placed in the pseudo far-field plane. The position of the pseudo far field plane may be estimated using the lens maker's equation:

$$1/f=1/S_1+1/S_2.$$

At the estimated far-field the intensity profiles are now recorded for the current settings $I=1.1\ I_{th}$; $I=2\ I_{th}$; $I=3\ I_{th}$ until the maximum current. These intensity profiles are now compared with the intensity profiles in the real far field and if discrepancy occur the position of the spatial filter is changed until the intensity profiles of the real far-field are completely reproduced.

Measurering the intensity profile using the first reflection from the wedge (step 904): The far field plane of the first reflection from the wedge 309 is estimated by inserting a convex lens. A beam analyser is placed in the far-field plane.

Establishment of the asymmetric feedback into the diode laser (step 905): A mirror 306 or a reflection grating is placed right behind the spatial filter 304. Both components should substantially be placed in the far-field plane. The mirror 306 should be oriented so that the output is directed exactly back into the laser diode 301. If a grating is used instead of the mirror it should be aligned such that the first diffraction order is directed back into the laser. The mirror or the grating is adjusted until the intensity profile monitored by the beam analyser is changed significantly.

Adjusting the spatial filter until a single-lobed output beam with low M2 is obtained (step 906): The spatial filter is now fully open to transmit the feedback beam. Subsequently, the centre part 304a of the spatial filter which is proximal to the centre of the angular intensity distribution of the laser beam, in the above example the razor blade 304a, is slowly inserted to cut the centre part of the beam. This inner edge of the spatial filter is adjusted towards a distal position where the diode laser is forced to operate in a spatial mode with high mode number which normally is not present in the free running laser. When the centre part of the filter is adjusted, the distal part 304b of the filter is inserted and adjusted. The intensity profile shown on the beam analyzer should be observed when the filtering is performed. When the filter is correctly adjusted, the intensity profile is narrowed down and its shape changes from a broad distribution to a double lobed distribution comprising a small and a large peak as illustrated by FIG. 4. Preferably, the chosen spatial mode corresponding to the double lobed distribution is situated at one of the edges of the broad spatial distribution.

A mirror 303 is now inserted in the pseudo far-field plane and this mirror couples out the large intensity peak of the doubled lobed distribution. The $M^2$ of the output beam is now monitored using a $M^2$ beam propagation analyser. The spatial filter in the feedback circuit is adjusted carefully until the $M^2$-value is minimized.

A spatial filter placed in the pseudo far-field is now used to filter the output lobe. The output filter is now adjusted until the $M^2$-value is further minimized. As an example a so-called half-mirror with a sharp cutting edge may be used for simultaneously filtering and coupling out the output beam. The purpose of the filtering of the output beam is to remove noise from the single lobed output beam. This noise has significant influence on the $M^2$-value.

The invention claimed is:

1. A laser system for an image setter, comprising:
a laser diode adapted to emit a first light beam, the first light beam having a spatial intensity distribution comprising a plurality of spatial modes wherein each spatial mode has a mode number assigned to it, and wherein each spatial mode has a twin-lobed intensity distribution including a first and a second lobe,
selection means adapted to select a first lobe of at least one of the twin-lobed intensity distribution;
a reflector
the laser diode and the reflector defining a cavity and the reflector being adapted to reflect the selected first lobe back into the laser diode as a second light beam, thereby providing the second lobe of the at least one twin-lobed intensity distribution as an output beam;
the selection means being adapted to select the first lobe corresponding to a spatial mode having a higher mode number greater than a spatial mode with maximum gain; and
wherein the selection means is adapted to select a spatial mode which is substantially not present in the first light beam when the laser diode is operated without the reflector.

2. The laser system according to claim 1, wherein the selection means is adapted to substantially select a single spatial mode.

3. The laser system according to claim 1, further including at least one optical lens placed within the cavity defined by the laser diode and the reflector, and the selection means is located substantially in the Fourier plane of the at least one optical lens.

4. The laser system according to claim 1, wherein the laser diode comprises a light-emitting facet with a reflectivity substantially between 0.01% and 4%.

5. The system according to claim 4, wherein the reflectivity of the light emitting facet is 0.2%.

6. The laser system according to claim 4, wherein the reflectivity of the light emitting facet is adjusted to correspond to the spatial mode of the second light beam.

7. The laser system according to claim 1, further including an optical element inside the cavity, the optical element having a transmittance of less than 100%.

8. The laser system according to claim 7, wherein the transmittance of the optical element is adjustable.

9. The laser system according to claim 1, wherein the laser diode is a laser diode bar.

10. The laser system according to claim 1 wherein the laser diode is a stacked laser array.

11. A laser system for an image setter, comprising:
a laser diode adapted to emit a first light beam, the first light beam having a spatial intensity distribution comprising a plurality of spatial modes wherein each spatial mode has a mode number assigned to it, and wherein each spatial mode has a twin-lobed intensity distribution including a first and a second lobe,
selection means adapted to select a first lobe of at least one of the twin-lobed intensity distribution;
a reflector;
the laser diode and the reflector defining a cavity and the reflector being adapted to reflect the selected first lobe back into the laser diode as a second light beam, thereby providing the second lobe of the at least one twin-lobed intensity distribution as an output beam;
the selection means being adapted to select the first lobe corresponding to a spatial mode having a higher mode number greater than a spatial mode with maximum gain;
wherein the selection means comprises a first spatial filter placed within the cavity defined by the laser diode and the reflector; and wherein the first spatial filter has an aperture of adjustable size.

12. The laser system according to claim 11, wherein the first spatial filter has an adjustable position.

13. A laser system for an image setter, comprising:
a laser diode adapted to emit a first light beam, the first light beam having a spatial intensity distribution comprising a plurality of spatial modes wherein each spatial mode has a mode number assigned to it, and wherein each spatial mode has a twin-lobed intensity distribution including a first and a second lobe,
selection means adapted to select a first lobe of at least one of the twin-lobed intensity distribution;
a reflector;
the laser diode and the reflector defining a cavity and the reflector being adapted to reflect the selected first lobe back into the laser diode as a second light beam, thereby providing the second lobe of the at least one twin-lobed intensity distribution as an output beam;
the selection means being adapted to select the first lobe corresponding to a spatial mode having a higher mode number greater than a spatial mode with maximum gain; and further including a second spatial filter adapted to allow the transmission of a part of the first light beam not selected by the selection means.

14. A method of aligning a laser system for emitting an output beam where the laser system comprises:
a laser diode adapted to emit a first light beam along an axis, the first light beam having a spatial intensity distribution comprising a plurality of spatial modes where each spatial mode has a mode number assigned to it, and wherein each spatial mode has a twin-lobed intensity distribution including a first and a second lobe,
selection means adapted to select a first lobe of at least one of the twin-lobed intensity distributions, and
a reflector where the laser diode and the reflector define a cavity and where the reflector is adapted to reflect the selected first lobe back into the laser diode as a second light beam thereby providing the second lobe of the at least one twin-lobed intensity distribution as an output beam,
the method comprising the step of:
aligning the selection means such that it selects the first lobe corresponding to a spatial mode with a higher mode number than a spatial mode with maximum gain wherein
the selection means comprises a first spatial filter placed within the cavity and comprising an inner edge (304a) with an adjustable position proximal to the axis and an outer edge (304b) with an adjustable position distal to the axis the method further comprising the steps of:
measuring a predetermined property of the first light beam
adjusting the position of the inner edge of the first spatial filter until the predetermined property has a predetermined value
adjusting the position of the outer edge of the first spatial filter until predetermined property is substantially optimized.

15. The method according to claim 14, wherein the predetermined property is a measure of the ability of at least a part of the first light beam corresponding to the output beam to be focused.

16. The method according to claim 15, wherein the predetermined property is an $M^2$ value of the output beam.

17. The method according to claim 14, wherein the predetermined property is a shape of an intensity distribution of the first light beam.

18. The method according to claim 17, wherein the step of adjusting the position of the inner edge further includes adjusting the position of the inner edge of the first spatial filter until an angular intensity distribution of the output beam has a minimal far-field angle.

19. A method of aligning a laser system for emitting an output beam where the laser system comprises:
a laser diode adapted to emit a first light beam along an axis, the first light beam having a spatial intensity distribution comprising a plurality of spatial modes where each spatial mode has a mode number assigned to it, and wherein each spatial mode has a twin-lobed intensity distribution including a first and a second lobe,
selection means adapted to select a first lobe of at least one of the twin-lobed intensity distributions, and
a reflector where the laser diode and the reflector define a cavity and where the reflector is adapted to reflect the selected first lobe back into the laser diode as a second light beam thereby providing the second lobe of the at least one twin-lobed intensity distribution as an output beam,
the method comprising the step of:
aligning the selection means such that it selects the first lobe corresponding to a spatial mode with a higher mode number than a spatial mode with maximum gain wherein the step of aligning the selection means further includes the step of aligning the selection means such that the selection means selects a spatial mode which is substantially not present in the light beam when the laser diode is operated without the reflector.

20. The method according to claim 19, wherein the laser diode comprises a light-emitting facet with a reflectivity between 0.01% and 4%.

21. The method according to claim 20, wherein the reflectivity of the light-emitting facet is 0.2%.

22. The method according to claim 19, wherein the system further includes an optical element inside the cavity, the optical element having a transmittance which is smaller than 100%.

23. The method according to claim 19, wherein the system further includes at least one optical lens placed inside the cavity, and the first spatial filter is located substantially in the Fourier plane of the at least one optical lens.

24. The method according to claim 19, wherein the system further comprises a second spatial filter adapted to transmission of a second part of the light beam which is not transmitted through the first spatial filter.

25. The method according to claim 19, wherein the laser diode is a laser diode bar.

26. The method according to claim 19 wherein the laser diode is a stacked laser array.

27. The method according to claim 19 wherein the laser system further includes an adjustable optical element adapted to control the energy of the second light beam, and the method comprising the steps of:
measuring a characteristic of an output laser beam of the laser system; and
adjusting the adjustable optical element until the characteristic has a predetermined value.

28. The method according to claim 27, wherein the adjustable optical element is an optical element with adjustable transmittance.

29. The method according to claim 27, wherein the adjustable optical element is a spatial filter with an adjustable aperture.

30. The method according to claim 29, wherein the characteristic is the spatial coherence of the output beam.

31. The method according to claim 27, wherein the characteristic is the power of the output beam.

32. The method according to claim 27, wherein the characteristic is the angular power density of the output beam.

33. A method of aligning a laser system for emitting an output beam where the laser system comprises:

a laser diode adapted to emit a first light beam along an axis, the first light beam comprising a plurality of spatial modes where each spatial mode has a mode number assigned to it, selection means adapted to select a predetermined part of the first light beam, and a reflector where the laser diode and the reflector define a cavity and where the reflector is adapted to reflect the selected part of the first light beam back into the laser diode as a second light beam, the method comprising the step of:

aligning the selection means such that it selects a part of the first light beam corresponding to a spatial mode with a higher mode number than a spatial mode with maximum gain, wherein the step of aligning the selection means further includes the step of aligning the selection means such that the selection means selects a spatial mode which is substantially not present in the light beam when the laser diode is operated without the reflector.

* * * * *